United States Patent [19]

Buckendorf et al.

[11] 4,359,654
[45] Nov. 16, 1982

[54] ALTERNATING POLARITY POWER SUPPLY CONTROL APPARATUS

[75] Inventors: Louis H. Buckendorf, Plymouth; Marc D. Hartranft, Brooklyn Park, both of Minn.

[73] Assignee: Honeywell Inc., Minneapolis, Minn.

[21] Appl. No.: 116,052

[22] Filed: Jan. 28, 1980

[51] Int. Cl.² .............. H03K 17/60; H01L 29/72
[52] U.S. Cl. ................................. 307/571; 307/279; 307/304
[58] Field of Search .............. 307/571, 279, 268, 304, 307/254; 357/22, 23

[56] References Cited

U.S. PATENT DOCUMENTS

| | | | |
|---|---|---|---|
| 3,112,410 | 11/1963 | Schmid | 307/254 |
| 3,131,312 | 4/1964 | Putzrath | 307/571 |
| 3,311,756 | 3/1967 | Nagata et al. | 307/571 |
| 3,348,062 | 10/1967 | Carlson et al. | 307/571 |
| 4,148,046 | 4/1979 | Hendrickson et al. | 357/22 |
| 4,148,047 | 4/1979 | Hendrickson et al. | 357/23 |
| 4,152,714 | 5/1979 | Hendrickson et al. | 357/22 |
| 4,256,977 | 3/1981 | Hendrickson | 307/304 X |
| 4,256,979 | 3/1981 | Hendrickson et al. | 307/304 X |

Primary Examiner—Rolf G. Hille
Attorney, Agent, or Firm—Theodore F. Neils

[57] ABSTRACT

An electronic switching circuit is provided for controlling transfer of electrical power from an alternating polarity electrical power supply to a load means through use of a field-effect transistor device as the primary power controlling element. A bypass means is used to provide shunting between one of the terminating regions of the field-effect transistor device and its substrate in situations where the field-effect transistor device is passing substantial current.

18 Claims, 2 Drawing Figures

ALTERNATING POLARITY POWER SUPPLY CONTROL APPARATUS

Reference is hereby made to earlier filed copending applications by T. E. Hendrickson entitled "Alternating Polarity Power Supply Control Apparatus" having Ser. No. 973,215, now U.S. Pat. No. 4,256,977 issued Mar. 17, 1981 by T. E. Hendrickson, et al., entitled "Alternating Polarity Power Supply Control Apparatus" having Ser. No. 973,463, now U.S. Pat. No. 4,256,979 issued Mar. 17, 1981 and by T. E. Hendrickson, et al., entitled "Semiconductor Apparatus" having Ser. No. 24,840. Each of these copending applications are assigned to the same assignee as is the present application.

BACKGROUND OF THE INVENTION

The present invention is related to circuits in which a field-effect transistor device controls power transfer from an alternating polarity electrical power supply to a load means, particularly when such field-effect transistor devices are capable of being integrated into monolithic integrated circuits.

Various solid state devices have been used in circuits as the primary means for controlling power transfer from an alternating polarity electrical power supply to whatever kind of load means is of interest for use in the circuit. Noting the three above-referenced applications, one of the applications discloses such field-effect transistor devices as are suitable for use as the primary element for controlling power transfer from an alternating polarity electrical power supply to such loads, and the other two show various circuit means for use in conjunction with such field-effect transistor devices to direct operation of these devices. As set out therein, the field-effect transistor device is a device which can provide symmetrical, bidirectional current conducting capability for use in alternating polarity power supply circuits. Particularly useful are devices which are effectively insulated-gate field-effect transistors (IGFET's) often metal-oxide-semiconductor field-effect transistors (MOSFET's), which have the further advantage of having the gate or control regions therein very well isolated from the remaining portions of the device including the channel region and the terminating regions at the ends of the channel region.

Such electrical isolation between the gate or control region, of an IGFET device and its remaining portions aids in providing a control circuit having as its purpose the directing of the operation of this transistor device. This isolation is particularly helpful when the control circuits and the transistor device are formed in a monolithic integrated circuit chip because a difficult control problem can arise when the power supplied to the integrated circuit is from an alternating polarity power supply. Such monolithic integrated circuit configurations must provide for the operation of the primary power transfer control MOSFET device in the control of power transfers from the alternating polarity power supply to the load, while also providing for operation of other circuit components further provided in the monolithic integrated circuit chip.

As is well known, electronic component device theory shows that field-effect transistors are operated by controlling the voltage appearing between the gate thereof and the connection to that one of the two channel terminating regions therein which is effectively serving as the transistor source. Difficulties arise in those circuits using a field-effect transistor control power transfers from an alternating polarity power supply to a load means because the two connections to the channel region of such a device serve alternately as source connections rather than one of them serving continually as the source connection.

Figure 1:
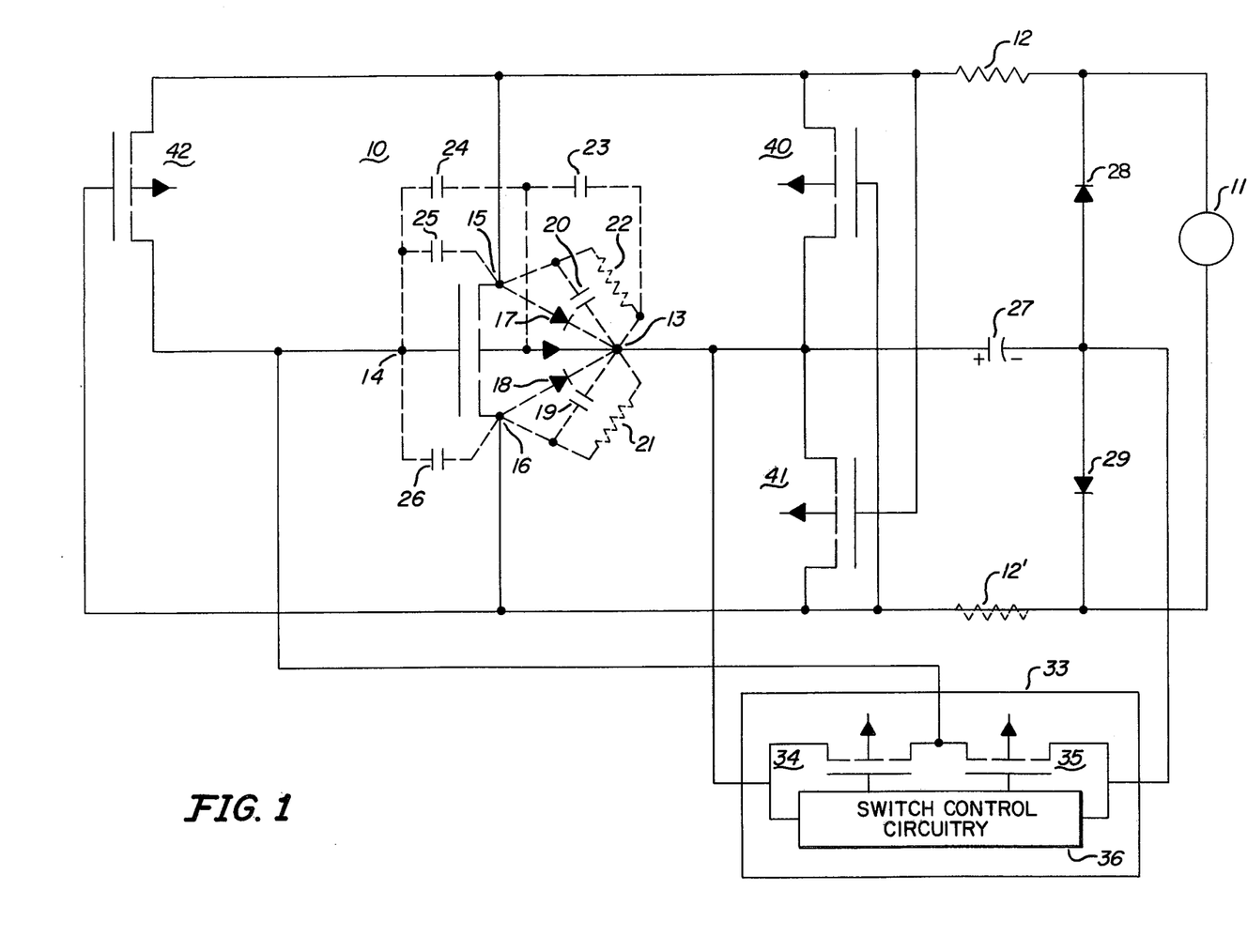
FIG. 1 shows a schematic diagram of a kind of circuit for controlling power transfers from an alternating polarity electrical power supply to a load means.

FIG. 1 shows an abbreviated version of a circuit disclosed in the control circuit application referenced above having the largest serial number. This circuit uses what is effectively an enhancement mode, p-channel, IGFET, 10, for controlling power transfers from alternating polarity electrical power supply, 11, to a load means, 12, or alternatively to a load means, 12', shown in dashed lines. Device 10 can be a device of the nature disclosed in the application referenced above having the smallest serial number.

An advantage of the circuit shown in FIG. 1 herein is that the circuitry for controlling power transfers through transistor 10 from supply 11 to load means 12 can be operated from electrical power supplied solely by alternating power supply 11. That is, a control switch means, 33, is shown for operating transistor 10. Control switch means 33 can be operated solely from voltage developed across a capacitor, 27, connected to substrate 13 of transistor 10, this voltage being derived ultimately from supply 11. Further advantages in the circuit of FIG. 1 come about because of the provision of several bypass transistors, 40, 41, and 42, which shunt certain parasitic circuit components associated with transistor device 10, and which thereby permit operating the circuit of FIG. 1 at higher polarity alternation frequencies in power supply 11 than would otherwise be possible.

These transistor 10 associated circuit components which affect circuit operation, but are only parasitic components inherent in transistor 10, are presented in equivalent "lumped" form and are shown by dashed lines in FIG. 1, they again all being present as the result of the actual physical structure of transistor 10. Of course, every transistor physical structure leads to having, effectively, parasitic circuit components associated therewith. However, such parasitic components are more likely to be significant in value for a power control transistor device, such as transistor 10, compared to signal control transistors because the power transistors usually are of a relatively large physical size when compared to transistors used for controlling signals only. Thus, parasitic components are explicitly shown associated only with transistor 10 in FIG. 1 even though parasitic components are also associated with the structures of the other transistors shown in FIG. 1. The assumption is that in practice, these other transistors have associated parasitic components that would have a relatively insignificant effect on the operation of the circuit in FIG. 1.

Field-effect transistor 10, being a p-channel IGFET, is provided in and on a substrate, 13, of a semiconductor material of n-type conductivity. The channel connection or terminating regions, 15 and 16, which terminate the ends of the channel region (when a channel is induced) in transistor 10 and can serve as source and drain regions therein, are formed by diffusion or implantation of p-type conductivity impurities into the substrate material. Parasitic diodes are formed in the structure of transistor 10 by the semiconductor pn junctions occurring between regions 15 and 16, on the one hand, and a substrate of transistor 10 on the other. These diodes are designated 17 and 18 in FIG. 1.

Also associated with these pn junctions are parasitic capacitances, 19 and 20, and parasitic resistances, 21 and 22. Further parasitic capacitances present are a channel-to-substrate capacitance, 23, and a gate-to-channel capacitance, 24. Two other parasitic capacitances, 25 and 26, are shown which are effective between gate 14 and one of the channel terminating regions 15 or 16. All of these parasitic components will have more or less of an effect on the operating behavior of transistor 10, and so in the behavior of the circuit in which transistor 10 is provided. The significance of the effects depends on the conditions existing in such a circuit and the values of the parasitic components. Of course, capacitance 24 is essential for switching on transistor 10 through forming a channel, yet this capacitance and the other parasitic component shown with transistor 10 are normally desired to contribute as insignificantly as possible to the circuit operation.

At sufficiently low frequencies, the parasitic capacitance as shown in connection with transistor 10 in FIG. 1 will not be significant factors in the operation of the circuit of this figure. Also, the leakage resistances 21 and 22 of FIG. 1 are usually sufficiently large so that they will not be significant in the operation of this circuit.

Further, note that load means 12 could also have a reactance component thereto, but this has not been shown, and load means 12 will be described as being resistive for ease of understanding and exhibition. This is also true of the alternative to load means 12, that is load means 12'. Load means 12' can be used in place of load means 12 with similar operating results in the circuit of FIG. 1 because of the symmetry inherent therein. This point is mentioned in the above referenced control circuit.

In FIG. 1, there are two diodes, 28 and 29, connected across alternating polarity power supply 11. Diode 28 has its cathode connected to a circuit portion including alternating polarity power supply 11 and load means 12, and has the anode thereof connected to energy storage capacitor 27. The anode of diode 29 is also connected to energy storage capacitor 27. The cathode of diode 29 is connected to power supply 11, i.e. again to the circuit portion arrangement including supply 11 and load means 12. As indicated in the above-referenced applications involving control apparatus, several of the transistors in the circuit of FIG. 1 can each have its substrate connection electrically connected in common with each of the other transistors as would occur if they were jointly formed in a single monolithic integrated circuit chip. Circumstances in which this is possible are indicated or referenced in the patent applications just mentioned.

As indicated above, the sole source of power used to operate the circuit of FIG. 1 is alternating polarity supply 11. Supply 11 not only provides power for controlled transfer to load means 12 (the load chosen for the following description of the FIG. 1 circuit operation), upon being selected to do so by appropriately activating switching means 33, but also provides power to be stored in capacitor 27 to operate the circuitry of switching means 33 and perhaps other circuits. Of course, a separate power supply means could be used in place of capacitance 27, and this is done to use a depletion mode device in place of enhancement mode transistor 10 as indicated in the above referenced control circuit applications. Hence, in the arrangement of FIG. 1, with constant polarity voltage being supplied to switching means 33 from across capacitor 27, a pair of transistors, 34 and 35, explicitly shown as part of switching means 33 and the associated switch control circuitry, 36, are all electrically energized by the stored electrical energy provided in capacitor 27. When being operated, switch means 33 has either transistor 34 in the "on" condition and transistor 35 "off," or vice versa, as determined by switch control circuitry 36. As a result, transistors 34 and 35 together operate in series as a single pole, double throw switch.

In the operation of the FIG. 1 circuit, the two channel connection, or termination, regions 15 and 16 of transistor 10 alternately serve as source and drain, depending on which one is positive with respect to the other in a cycle of the output voltage provided by supply 11. Consider switch means 33 electrically connecting gate 14 to the side of capacitor 27 connected to substrate 13. In this switch selection for switch means 33, gate 14 of transistor 10 will approximately be at the positive voltage appearing on one or the other side of supply 11 alternately during a cycle by virtue of one of diodes 17 or 18 correspondingly being forward biased. Also correspondingly, one of the diodes 28 or 29 will be forward biased. In this situation, substrate 13 is forced to be at the voltage supplied at whichever of terminating regions 15 or 16 is positive less the voltage drop across the associated one of forward biased diodes 17 or 18. The other of diodes 17 or 18, associated with the transistor 10 terminating region serving as the drain, will be reverse biased.

The voltage drop across either of diodes 17 or 18, when forward biased, will always be less than the threshold voltage of transistor 10. Since gate 14 will, in these circumstances, never be more than approximately the voltage drop across one of diodes 17 or 18 from the voltage appearing at that one of terminating regions 15 or 16 which is positive, gate 14 will never differ in voltage from the terminating region serving as a source by an amount equal to the threshold voltage of transistor 10, i.e. transistor 10 will be in the "off" condition according to device theory. There will thus be no power transfer from supply 11 to load means 12.

As a result of this the above switch selection for switch means 33, assuming first that the side of supply 11 connected to load means 12 is relatively positive with respect to the other side of supply 11, a small charging current will flow through load means 12, parasitic diode 17, capacitor 27, and diode 29 to thereby charge capacitor 30. This assumes, initially, that the parasitic component shunting transistors 40, 41, and 42 are not present in the circuit of FIG. 1. The following change in polarity of supply 11, again assuming the omission of transistors 40, 41, and 42, leads to a comparable charging current flowing through parasitic diode 18, capacitor 27, and diode 28 to thereby again charge capacitor 30 to the same polarity as occurred during the charging in the previous half cycle of supply 11. In these circumstances, the polarity of the voltage across capacitor 30 in such that the side of capacitor 30 connected to substrate 13 is positive. Also, the voltage developed across capacitor 27 will substantially be equal to the peak value of the positive voltage supplied alternately at the sides of supply 11.

In the opposite switch selection of switch means 33, gate 14 of transistor 10 will be electrically connected to the side of capacitor 27 not connected to substrate 13. As a result, the voltage between gate 14 and whichever of terminating regions 15 and 16 is positive, and therefore acting as the transistor source, will be equal to whatever voltage is across capacitor 27 plus the corresponding parasitic diode voltage drop. In the usual situation, transistor 10 will have been in the "off" conditon, as just described, and so the voltage across capacitor 27 will be approximately the voltage supplied by supply means 11 as noted above. In this case, and in the usual case, the voltage in capacitor 27 will substantially exceed the threshold voltage of transistor 10 so that transistor 10 will be switched to the "on" condition. Transistor 10 will remain in the "on" condition for this connection of switch means 33 so long as the voltage across capacitor 27 remains greater than the threshold voltage of transistor 10.

In contrast to the situation described above with transistor 10 in the "off" condition, capacitor 27 does not experience similar charging actions in alternate half cycles of a supply 11 cycle if transistor 10 is in the "on" condition assuming, again, that transistors 40, 41, and 42 are initially omitted in the circuit of FIG. 1. If the side of supply 11 not connected to load means 12 is positive, capacitor 27 will be charged by a charging current flowing through parasitic diode 18, capacitor 27, and diode 28 which tends to charge capacitor 27 to a voltage of the same polarity as would occur in charging capacitor 27 with transistor 10 in the "off" condition. This charging occurs because most of the voltage being supplied from supply 11 will be dropped across capacitor 27 and diode 28 approximately in parallel with load means 12 so that there is a substantial voltage across capacitor 27 in this polarity of supply 11.

But, in the opposite polarity of supply 11 with the side thereof connected to load means 12 being positive, no charging current will flow through capacitor 27. With most of the voltage of supply 11 being dropped across load means 12 there will not be any significant voltage applied across capacitor 27. Parasitic diodes 17 and 18 and diode 28 will all be reverse biased. In this situation the electrical energy for operating switching means 13 must be supplied entirely by energy stored on capacitor 27.

The presence of the parasitic components associated with transistor 10 leads to detrimental effects occurring in the operation of the circuit shown in FIG. 1 in the absence of the bypass means provided there as indicated in the above-identified application having the largest serial number. The charging current for capacitor 27 which passes through parasitic diodes 17 and 18 of transistor 10 in the "off" condition can result in bipolar transistor action occurring between terminating regions 15 and 16 of transistor 10. This is because these regions and the channel region form an effective pnp transistor which tends to provide a more or less conductive pathway between terminating regions 15 and 16 otherwise intended to be electrically isolated from one another in these circumstances. Also, the charge on the parasitic capacitances associated with transistor 10 may lead to delays in the intended operation of the various regions of transistor 10 because the charged parasitic capacitances tend to maintain earlier existing conditions about transistor 10 until these parasitic capacitances have been discharged. To circumvent such detrimental effects in the operation of the circuit of FIG. 1 of the present application, several bypass transistors are provided in the circuit of FIG. 1 for reducing or eliminating certain of these effects resulting from the parasitic components associated with transistor 10.

The three bypass transistors are designated 40, 41, and 42 in FIG. 1 and are shown as enhancement mode, p-channel, field-effect transistors. They may also be fabricated in a single integrated monolithic circuit chip along with transistor 10, the circuitry of switch means 33, etc. as described in the above-referenced application having the largest serial number. Bypass transistors 40, 41 and 42 are affected in reducing or eliminating the effects of the parasitic components associated with transistor 10 only when transistor 10 is in the "off" condition.

In operation, with transistor 10 being in the "off" condition by virtue of switch means 33 electrically connecting gate 14 to substrate 13, a small current for charging capacitor 27 alternately flows through transistors 40 and 41, as a result of their switching on and off in response to the polarity changes in supply 11, rather than through parasitic diode 17 and 18, respectively, of transistor 10 in the circuit operation described above. Reducing or eliminating current flow through parasitic diode 17 and 18 serves to substantially eliminate bipolar action in transistor 10 between terminating regions 15 and 16 and the channel region thereof. This reduction in current flow also results in improved frequency response of the circuit containing transistor 10 because transistors 40 and 41 provide low impedance discharge paths for certain of the parasitic capacitances therein.

Transistor 42 shunts gate-to-source capacitance 25 during one polarity of supply 11 to thereby improve frequency response and prevent loss of control of transistor 10 due to an accumulation of charge in this capacitance during operation times in which transistor 10 in the "off" condition. In the alternate half cycle of supply 11, i.e. the opposite polarity of supply 11, capacitance 26 is effectively shunted by transistor 41 and transistor 34 which are both in the "on" condition. Transistor 42 is off and has no effect on circuit operation in this condition.

However, when transistor 10 is switched by switching means 33 to the "on" condition, bypass transistors 40, 41 and 42 of the circuit of FIG. 1 become ineffective. The voltage drop between terminating regions 15 and 16 of transistor 10 is less than the threshold voltage of any of the transistors 40, 41 and 42 and FIG. 1 shows that this voltage drop across transistor 10 is also the voltage drop occuring between the gate and the effective source of transistors 40, 41, and 42. Thus, transistors 40, 41, or 42 are all switched to the "off" condition in the circuit of FIG. 1 when transistor 10 is in the "on" condition.

Thus, operation of the circuit of FIG. 1 when transistor 10 is in the "on" condition occurs just as described above for FIG. 1 when it was assumed that transistors 40, 41, or 42 were omitted in that FIG. 1. In one polarity of supply 11, a small charging current will flow to charge capacitor 27, the current flowing through a parasitic diode 18, capacitor 27, and diode 28. This occurs because the voltage of supply 11 is dropped across capacitor 27 and diode 28 connected approximately in parallel with load means 12. This current flowing through parasitic diode 18 will cause bipolar action between terminating regions 15 and 16 by virtue of the effect of pnp transistor present there as described above. If there is a desire to switch transistor 10 to the "off" condition, the bipolar action of the effective pnp transistor will tend to keep transistor 10 conducting, thus resulting in reduced control of transistor 10.

In the other half cycle of a cycle of supply 11, parasitic diodes 17 and 18 are reversed bias because of the voltage remaining on capacitor 27. As a result, substrate 13 of transistor 10 and capacitance 27 are not firmly related to any voltage occuring in the circuit of FIG. 1. In this situation, the parasitic capacitances of transistor 10, particularly capacitances 19 and 20, can accumulate a random amount of charge supplied by either supply 11 or capacitor 27 or both. This random accumulation of charge obtained on these parasitic capacitances causes the voltage on substrate 13 to vary randomly with respect to whichever terminating regions 15 and 16 is serving as a source. Such a situation may be reflected in a random variation of the threshold voltage of transistor 10 as well as in the threshold voltages of the other transistors shown in FIG. 1 which have their substrates, selectively, in common with transistor 10 as is the case when all these transistors are formed in the same monolithic integrated circuit chip.

For example, transistors 34 and 35 of switch means 33 and the transistors in the switch control circuitry 36 of switch means 33 will often be formed in the same monolithic integrated circuit chip as is transistor 10 and thereby share a common substrate. Thus, the switching on of transistor 10 leading to charging current flowing through parasitic diode 18 may cause the threshold voltages of the transistors in switch means 33 to vary randomly in a manner which could result in loss of control of transistor 10.

Further, random accumulation of charge in the parasitic capacitances associated with transistor 10 may also lead to additional delays in the intended operation of transistor 10 as the charged parasitic capacitances tend to maintain earlier conditions occurring about transistor 10 until these capacitances have been discharged. This can result in transistor 10 responding slowly, incompletely, or not at all to commands provided by switch means 33.

SUMMARY OF THE INVENTION

The invention provides a circuit with a field-effect transistor device which can be used in controlling power transfers between an alternating polarity power supply and a load means, with this supply and load, in operation, connected on either side of the device channel. A bypass means is connected to the substrate of the field-effect transistor device and to one side or the other of the device channel, with the bypass means providing a shunting action therebetween if the field-effect transistor device is in the "on" condition.

DESCRIPTION OF THE PREFERRED EMBODIMENTS

Figure 2:
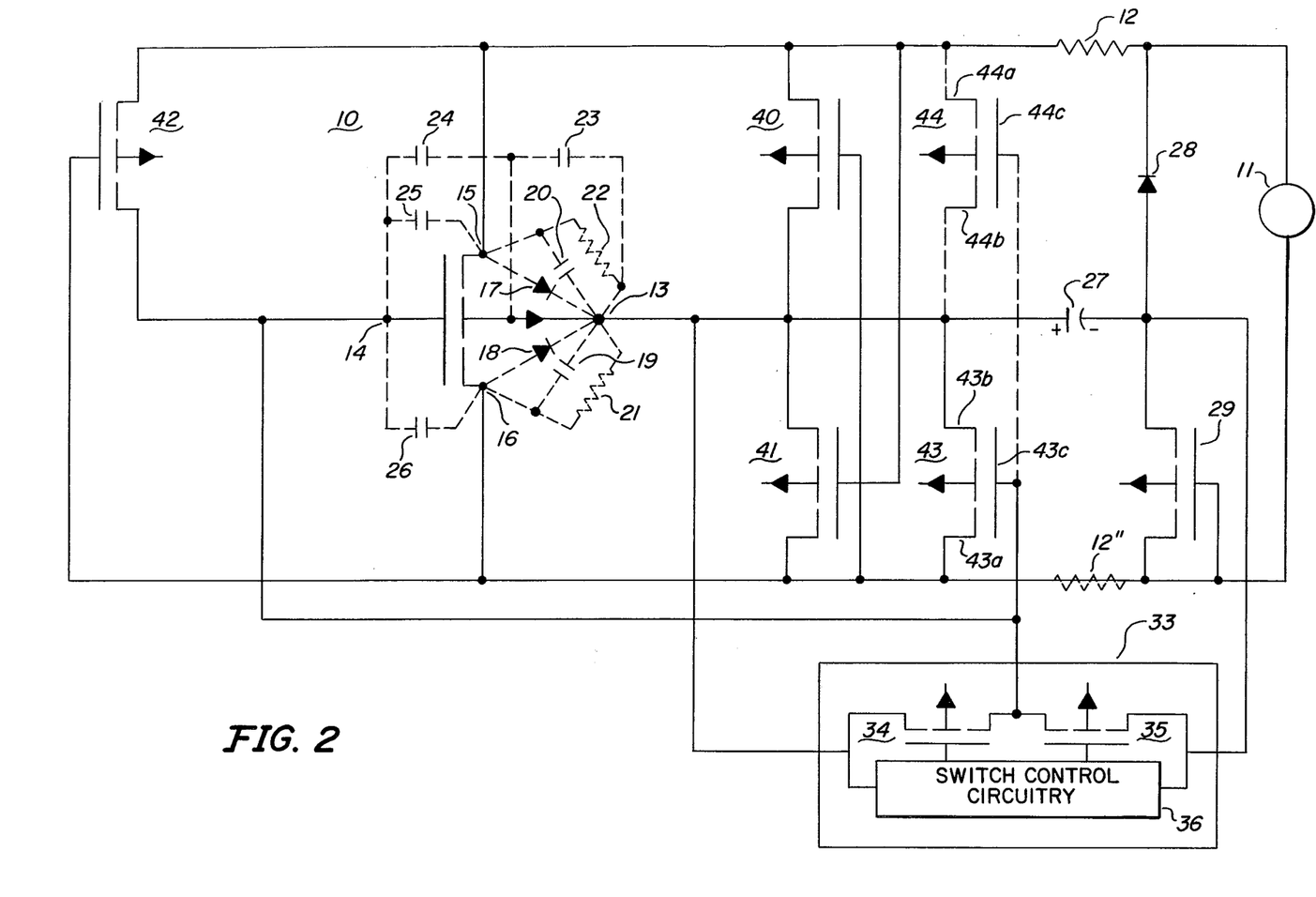
FIG. 2 shows an embodiment of the circuit of the invention in schematic diagram form to be used for the same purpose.

FIG. 2 shows an improved version of the circuit of FIG. 1. The same component designations have been retained in FIG. 2 as were used for corresponding components in FIG. 1.

In FIG. 2, alternating polarity power supply 11 in series with load means 12 is again provided on either side of transistor 10, this series combination being connected to terminating region 15 of transistor 10 on one side of the combination and to terminating region 16 of transistor 10 on the other side. Electrical energy storage capacitor 27 is connected between substrate junction 13 of transistor 10 and the common junction of diode 28 and what is effectively diode 29 of FIG. 1. However, diode means 29 is shown in FIG. 2 as an enhancement mode, p-channel, IGFET having its gate electrically connected to that terminating region thereof which is connected directly to power supply 11. This terminating region of transistor 29 with the gate of this transistor connected to it serves as the cathode of diode means 29. The other terminating region of transistor 29 serves as the anode of the diode being provided by transistor 29. The cathode of diode 28 is connected to the junction of load means 12 and one side of supply 11.

Again an alternative location for a load means is shown by dashed line load 12' (use of which would require electrical isolation for device 29 which then might be an ordinary diode). Either of these load means shown could also have a reactive component but arebeing shown as being resistive for ease of understanding and exposition.

All of the parasitic circuit elements shown associated with transistor 10 in FIG. 1 are again shown with transistor 10 in FIG. 2. These parasitic elements are again provided in the circuit of FIG. 2 in dashed line form to indicate the elements are parasitic. Transistor 10 can again be a device of the kinds described in the patent application referenced above having the smallest serial number and so being effectively an enhancement mode, p-channel IGFET. Transistor 10 could be an ordinary enhancement mode, p-channel IGFET if little power is to be transferred to one of the load means 12 or 12' from supply 11. As indicated in the above-referenced control apparatus applications, the circuit of FIG. 2 can be modified slightly to permit use of a depletion mode device for transistor 10.

Again shown in FIG. 2 are bypass transistors 40, 41, and 42. As indicated in the above-referenced application having the largest serial number, certain of these bypass transistors can in some circumstances be substituted for by other types of bypass means including resistances. A terminating region in each of transistors 40 and 41 are again shown electrically connected to substrate 13 of transistor 10. The remaining terminating region in transistor 40 is connected to terminating regions 15 of transistor 10, and the remaining terminating region in transistor 41 is connected to terminating region 16 of transistor 10. The gate of transistor 40 is connected to terminating region 16 of transistor 10 while the gate of transistor 41 is connected to terminating region 15 of transistor 10. One terminating region of transistor 42 is connected to terminating region 15 of transistor 10 while the other terminating or transistor 42 is connected to gate 14 of transistor 10. The gate of transistor 42 is connected to terminating region 16 of transistor 10.

Switch control means 33 of FIG. 2 duplicates switch control means 33 of FIG. 1. That is, switch control means 33 again includes field-effect transistors 34 and 35 having a terminating region from each electrically connected together and to gate 14 of transistor 10. The remaining terminating region of transistor 34 is connected to substrate 13 of transistor 10 while the remaining terminating region of transistor 35 is connected to both the anodes of each of diode 28 and diode means 29. As before, switch control circuitry 36 of switch control means 33 directs operation of transistors 34 and 35 through connections to the gates of these transistors while also being connected to substrate 13 of transistor 10 on one side thereof and to the anodes of each of diode 28 and diode means 29 on the other side thereof.

A further parasitic bypass means, 43, is shown in FIG. 2 and is provided to prevent the injection of charge carriers into substrate 13 of transistor 10 when transistor 10 is in the "on" condition. Bypass means 43 is shown in FIG. 2 as an enhancement mode, p-channel MOSFET. Alternatively, another bypass transistor 44, is presented in FIG. 2 but in dashed lines to indicate that transistor 44 is an alternative. Either of transistors 43 or 44 can be used to shunt certain parasitic components associated with transistor 10, such shunting to be effective when transistor 10 is in the "on" condition.

Transistor 43 in the circuit of FIG. 2 has one of its terminating regions, 43a, connected to terminating region 16 of transistor 10. The other transistor 43 terminating region, 43b, is connected to substrate 13 of transistor 10. The gate region, 43c, of transistor 43 is connected to gate region 14 of transistor 10.

If transistor 44 is present, one transistor 44 terminating region, 44a, is connected to terminating region 15 of transistor 10 while the other transistor 44 terminating region, 44b, is connected to substrate 13 of transistor 10. The gate region, 44c, of transistor 44 is connected to gate region 14 of transistor 10.

The substrate of either of transistors 43 or 44 may be electrically connected directly to substrate 13 of transistor 10, and therefore to the substrates of the other transistors shown in the circuit of FIG. 2. Alternatively, but essentially the same, the substrates of transistors 43 or 44 may be electrically connected to that terminating region of each which serves as the drain therefor, either terminating region 43b or terminating region 44b. Quite often, the circuit of FIG. 2 will be desired to be implemented in a monolithic integrated circuit chip which will lead to the substrate of all of the transistors shown in the circuit of FIG. 2 being electrically connected in common. In these circumstances, diode 28 is continued to be shown by the ordinary diode symbol because providing a field-effect transistor to serve as diode 28 leads to certain difficulties mentioned in the above-referenced control apparatus applications.

In operation, consider first the situation where switch means 33 is such that gate region 14 of transistor 10 is electrically connected to substrate 13 of transistor 10. Beginning with the assumption that the side of supply 11 not connected to load 12 means is positive in the present portion of the supply 11 cycle, transistor 40 will have its gate connected to the most positive portion of the circuit and, hence, device theory indicates that transistor 40 will be switched to the "off" condition. This will also be true of transistor 42. On the other hand, transistor 41 will have its gate connected to a portion of the circuit which is relatively negative when compared to the voltage at the terminating regions thereof. As a result, transistor 41 will be switched to the "on" condition, at least if transistor 10 is switched into the "off" condition. This will be the case, since gate 14 of transistor 10 is connected to substrate 13 preventing any significant voltage difference occurring between gate 14 and terminating region 16 of transistor 10. Thus, a small charging current for capacitor 27 will flow through transistor 41, capacitor 27, and diode 28 in the absence of transistors 43 or 44 having an effect in the circuit in these circumstances.

However, the switching "on" of transistor 41 in these circumstances and the "on" condition of transistor 34 in connecting gate 14 to substrate 13 of channel 10 leads to gate region 43c of transistor 43 being electrically connected to both terminating regions of that transistor, 43a and 43b. Hence, the conditions which lead to transistor 10 being in the "off" condition also lead to transistor 43 also being in the "off" condition. Transistor 41, being switched "on" to serve as the bypass means for parasitic diode 18 of transistor 10, also serves as a bypass means between terminating region 43a and the substrate of transistor 43 to prevent any injection of charge carriers into the substrate of transistor 43 in the "off" condition. Note that transistors 34 and 41 both being in the "on" condition also serve to bypass certain parasitic capacitances associated with transistor 10.

If transistor 44 is in the circuit of FIG. 2, the "on" condition of transistor 34 in connecting gate 14 to substrate 13 of transistor 10 leads to gate region 44c of transistor 44 being connected to terminating region 44b of transistor 44. Since gate region 44c and terminating region 44b of transistor 44 are more positive than is terminating region 44a in the circumstances, device theory indicates that transistor 44 will also be in the "off" condition as the gate thereof is electrically connected to the terminating region thereof serving as the source therefor.

In a later portion of the cycle of supply 11, the polarity of the output voltages of supply 11 will reverse so that the side of supply 11 connected to load means 12 becomes positive. The gate of transistor 40 will then be connected to the most negative point in the circuit of FIG. 2. Device theory indicates that transistor 40 will be switched into the "on" condition at least as long as transistor 10 is in the "off" condition. Transistor 42 will also have its gate connected to the most negative point in the circuit of FIG. 11 and so will also be switched into the "on" condition. Transistor 41, on the other hand, will have its gate connected to a portion of the circuit which is positive relative to the voltage appearing at the terminating regions of transistor 41 and so transistor 41 will be switched into the "off" condition. Since transistor 34 is in the "on" condition in connecting gate 14 of transistor 10 to substrate 13 thereof, device theory indicates that transistor 10 will also be switched into the "off" condition since no appreciable voltage can develop between gate 14 and terminating region 15 thereof presently serving as the source for transistor 10.

Neither of transistors 43 or 44 will have a circuit effect which would change the state of the other transistors present in the circuit of FIG. 2 in these circumstances. Gate region 43c of transistor 43 will be electrically connected to terminating region 43b of transistor 43 through transistor 34 in switch means 33 being switched "on". Since terminating region 43b and gate 43c of transistor 43 will be connected to a point having a voltage more positive than that appearing at terminating region 43a of transistor 43, transistor 43 will be switched into the "off" condition. The "on" condition of transistors 34 and 40 leads to gate region 44c being electrically connected to both terminating regions 44a and 44b of transistor 44 so, that transistor 44 would also be in the "off" condition if present in the circuit of FIG. 2. Thus, a small charging current will flow to charge capacitor 27 through load means 12 of transistor 40, capacitor 27, and diode means 29.

Note that transistor 40 serves to shunt parasitic diode means 17 as well as certain of the parasitic capacitances associated with transistor 10. Transistor 40 also serves to bypass transistor 44, should transistor 44 be in the circuit, thereby preventing injection of charge carriers into the substrate of transistor 44 in these circumstances. Further, transistor 42 serves to bypass certain of the parasitic capacitances associated with transistor 10 in this polarity of supply 11.

Switch means 33 in the alternative situation can cause gate region 14 of transistor 10 to be electrically connected to the side of capacitor 27 which is connected to the anodes of each of diode 28 and to diode means 29. Consider this to be the situation, with transistor 35 being switched into the "on" condition, and further assume that the present portion of the cycle of supply 11 is such that the side of supply 11 not connected to load means 12 is positive. The "on" condition of transistor 35 leads to gate region 14 of transistor 10 being negative with respect to substrate 13 of transistor 10 by the amount of the voltage appearing on capacitor 27. Terminating region 16 of transistor 10 will be connected to the most positive voltage in the circuit and will be serving as the source of that transistor. Since the voltage at terminating region 16 of transistor 10 will be no more than a diode voltage drop greater than that at substrate 13 to which the positive side of capacitor 27 is connected, gate region 14 of transistor 10 will be quite negative with respect to terminating region 16 of transistor 10 serving as a source thereof in these circumstances. Thus, transistor 10 will be switched into the "on" condition. As a result, the voltage between terminating regions 15 and 16 of transistor 10 will be very small as most of the voltage drop will be across load means 12 (the load means chosen as the example in this operation description). This same small voltage appearing between the terminating regions of transistor 10 will also be a voltage across the combination of transistors 40 and 41 connected to the transistor 10 terminating regions at two of the terminating regions of transistors 40 and 41 and the gate regions thereof. Since the voltage between terminating regions of transistor 10 will be less than the threshold voltage of either of transistors 40 or 41, transistors 40 and 41 will be switched into the "off" condition.

The voltage at the gate of transistor 42 is connected to the most positive voltage in the circuit, and hence, device theory indicates that transistor 42 will also be switched into the "off" condition.

Note that the gate of transistor 43 is connected to the same point as is the gate of transistor 14 and that a terminating region (43a) of transistor 43 is connected to the same point as is terminating region 16 of transistor 10 serving as the source of transistor 10. Since this connection point for terminating region 43a of transistor 43 and terminating region 16 of transistor 10 is the most positive voltage in the circuit, transistor 43 will also be switched into the "on" condition as is transistor 10. Transistor 43 in the "on" condition shunts parasitic diode 18 and certain of the parasitic capacitances associated with transistor 10.

In these circumstances, a small charging current for capacitor 27 will flow through transistor 43 bypassing parasitic diode 18, through capacitor 27, and through diode 28 because most of the voltage supplied by supply 11 is dropped across capacitor 27 and diode 28, approximately in parallel with load means 12. As a result, transistor 43 provides a bypass means to prevent current from flowing through parasitic diode 18 of transistor 10 when transistor 10 is in the "on" condition. Thus, there is no injection of charge carriers into the substrate of transistor 10 in this situation which is just the desired result.

Further, substrate 13 of transistor 10 and all of the substrates of the other transistors in the circuit will be connected together in common in a typical implementation of the circuit, and so all these substrates (or the single common substrate in a monolithic integrated circuit implementation) will be connected to the most positive voltage in the circuit by virtue of transistor 43 being in the "on" condition. Thus, the parasitic capacitances associated with transistor 10 will be no longer able to randomly accumulate charge leading to varying threshold voltages for the various transistors in the circuit because terminating regions 15 and 16 and substrate 13 of transistor 10 are held in a fixed voltage relationship by virtue of transistors 43 and 10 being switched "on". In fact, with transistors 43 and 10 being switched "on" connecting substrate 13 to terminating region 16 and transistor 10 essentially connecting terminating region 15 to terminating region 16 of transistor 10, terminating regions 15 and 16 and substrate 13 are at approximately the same voltage potential.

Postponing the discussion concerning transistor 44 as an alternative to transistor 43, consider the circuit of FIG. 2 at a later point in the cycle of supply 11 in which the polarity of supply 11 is reversed so that the side of supply 11 connected to load mean 12 is positive. Gate region 14 of transistor 10 is still electrically connected, through transistor 35 being in the "on" condition, to the side of capacitor 27 connected to both diode 28 and diode means 29. Terminating region 15 of transistor 10 is at a voltage that is positive with respect to the voltage appearing on substrate 13 of transistor 10 to which the positive side of capacitor 27 is connected. Thus, gate region 14 is negative with respect to the voltage appearing on terminating region 15 of transistor 10 serving as the source thereof in these circumstances. As a result, transistor 10 switches into the "on" condition leading to a very small voltage difference occurring between terminating regions 15 and 16 of transistor 10.

This small voltage difference between terminating regions 15 and 16 in transistor 10 leads to the same small voltage difference appearing between the terminating region of transistor 42, connected to terminating region 15 of transistor 10, and the gate of transistor 42 connected to terminating region 16 of transistor 10. Since the voltage between terminating regions 15 and 16 of transistor 10 is less than the threshold voltage of transistor 42, transistor 42 is switched into the "off" condition.

Similarly, this same small voltage between terminating regions 15 and 16 in transistor 10 is supplied across transistors 40 and 41. The voltage difference between the terminating region of transistor 40 connected to terminating region 15 in transistor 10 and the gate of transistor 40 connected to terminating region 16 of transistor 10 will be less than the threshold voltage of transistor 40. Thus, transistor 40 is in the "off" condition. The gate of transistor 41 is connected to a voltage more positive than the voltage at either the terminating regions of transistor 41 and so transistor 41 is also in the "off" condition.

Terminating region 43b of transistor 43 is connected to the positive side of capacitor 27 and serves as the source thereof. Gate region 43c of transistor 43 is electrically connected, through transistor 35 being in the "on" condition, to the negative side of capacitor 27. Terminating region 43a of transistor 43 is connected to the negative side of supply 11. In these circumstances, device theory indicates that transistor 43 is switched into the "on" condition thereby again electrically connecting terminating region 16 of transistor 10 to substrate 13 thereof. Transistor 43 is prevented from discharging capacitor 27 by the presence of effective diode means 29 which is reversed biased by the voltage appearing on capacitor 27 acting through transistor 43. In these circumstances, there can be no substantial charging current provided for capacitor 27 by supply 11 since both diode 28 and diode means 29 connected to capacitor 27 are reverse biased. Thus, the voltage to operate switch means 33 is taken entirely from the energy stored in capacitor 27 for this polarity of supply 11.

The sum of the voltage drop between terminating regions 15 and 16 of transistor 10 and the voltage drop between terminating regions 43a and 43b of transistor 43, for the typical choice of these devices, will be less than the forward voltage threshold of parasitic diode 17. This will result in no current flowing in parasitic diode 17 thereby eliminating bipolar action because of such flow due to the bypass action of transistors 43 and 10. This bypass action also prevents certain parasitic capacitances associated with transistor 10 from charging to any significant voltage, reaching only a small substantially constant value. That is, terminating region 16 is electrically connected to substrate 13 by virtue of transistor 43 being "on".

As earlier indicated, transistor 44 can be used as an alternate to transistor 43 in the circuit of FIG. 2. In the situation where the side of supply 11 not connected to load means 12 is positive, the electrical connection by switch means 33 of gate region 14 of transistor 10 to side of capacitor 27 connected to the junction of diodes 28 and diode means 29 leads to transistor 10 being switched into the "on" condition for the about same reasons as when transistor 43 was present in the circuit. Again, transistors 40, 41, and 42 will be switched into the "off" condition for the same reasons given as when transistor 43 was in the circuit in these circumstances.

Because transistor 10 is switched into the "on" condition, nearly all of the voltage provided by supply 11 will be dropped across load means 12 with only a small voltage appearing between terminating regions 16 and 15 of transistor 10. Also, transistor 44, capacitor 27 and diode means 28 will form a series combination which will be across load means 12. Thus, terminating region 44a of transistor 44 will be at the most positive voltage of any of the terminals of transistor 44 and so will serve as a source therefor in these circumstances. Gate region 44c of transistor 44 is connected to gate region 14 of transistor 10 and so is connected to the negative side of capacitor 27 at the juncture of diodes 28 and diode means 29. Hence, transistor 44 will be switched into the "on" condition so that a current path will occur through the above-mentioned series combination across load means 12. As a result, part of the current passing through transistor 10 from terminating region 16 to terminating region 15 thereof will be diverted from passing through loads means 12 and will pass through this series combination providing a charging current for capacitor 27.

For the usual choice of devices for transistor 10 and for transistor 44, the sum of the voltage drop between terminating regions 15 and 16 of transistor 10 and the voltage drop between terminating regions 44a and 44b of transistor 44 will be less in value than the forward voltage threshold of parasitic diode 18. Hence, there will be no current flowing through parasitic diode 18 because of the bypass provided by the series combination of transistor 10 and transistor 44. This bypass will eliminate bipolar action due to current flowing through parasitic diode 18. Further, certain of the parasitic capacitances associated with transistor 10 are prevented from charging to any significant voltage value, and the voltage value reached is substantially constant. That is, the result of transistor 44 being switched to the "on" condition is to have substrate 13 of transistor 10 electrically connected to terminating region 15 thereof.

At a later point in the cycle of supply 11 when the polarity of this supply has reversed so the side thereof connected to load means 12 is positive, transistor 10 will still be switched into the "on" condition for the reasons given above in a situation where transistor 43 was in the circuit with gate 14 thereof still being connected to the side of capacitor 27 connected to both diode 28 and diode means 29. Again, transistors 40, 41, and 42 will be switched into the "off" condition for the reasons given when considering transistor 43 in the circuit.

Terminating region 44b will be held positive by the voltage occurring on capacitor 27 and so will serve as the source of transistor 44 for this polarity of supply 11. Since gate region 44c of transistor 44 is connected to gate region 10 of transistor 14 which is connected to the negative side of capacitor 27 at the junction of diode 28 and diode means 29, device theory indicates that transistor 44 will be switched into the "on" condition. Capacitor 27 is prevented from being discharged by transistor 44 by the presence of diode 28. Diode 28 is reverse biased by the sum of the voltage on capacitor 27 and the voltage drop across load means 12 acting through transistor 44. The "on" condition of transistor 44 leads to substrate 13 of transistor 10 being electrically connected to terminating region 15 of transistor 10 so that the parasitic capacitances associated with transistor 10 are shunted by transistor 44 preventing them from accumulating a random amount of charge. In this polarity of supply 11 with transistor 10 being in the "on" condition, no charging current will flow to charge capacitor 27 as both diode 28 and diode means 29 are reversed biased. Again, the power for switch means 33 will be supplied entirely from electrical energy stored in capacitor 27.

While the operation of the circuit of FIG. 2 has been discussed in terms of having either transistor 43 or transistor 44 present in the circuit as an alternative to the other, the circuit of FIG. 2 will operate if both transistors 43 and 44 are present in the circuit together. While gate regions 43c of transistor 43 and 44c of transistor 44 have been shown connected to gate region 14 of transistor 10 so that transistors 43 and 44 experience the identical commands from switch means 33 experienced by transistor 10, this is not necessary. Other circuit arrangements for gate 43c of transistor 43 and gate 44c of transistor 44 can be used so long as the circuit results in either transistor 43 or 44, or both, being switched into the "on" condition whenever transistor 10 is in the "on" condition.

That the power for operating circuit of FIG. 2 is supplied solely from the alternating polarity power supply 11 is only to be taken as an advantage in this circuit, not a requirement for the circuit. That is, capacitor 27 could be replaced by some type of voltage source which would permit currents to be passed therethrough such as a battery.

The presence of transistors 40, 41, and 42 in the FIG. 2 circuit permits providing shunting action for the parasitic components associated with transistor 10 when transistor 10 is in the "off" condition. Clearly, the omitting of these transistors will not affect the operation of the circuit of FIG. 2 when transistor 10 is in the "on" condition, the situation in which either transistor 43 or transistor 44, or both, take an active role in the circuit operation. Thus, there may be circumstances when the omission of any or all of transistors 40, 41, and 42 will be useful while still retaining either transistor 43 or transistor 44, or both, in the operation of the circuit shown in FIG. 2. Also, as indicated above, certain of transistors 40, 41, or 42 may be provided in some circumstances by other kinds of circuit components such as resistors as indicated in the above-referenced circuit control application having the largest serial number. Also, the circuit of FIG. 2 may be entirely fabricated in a single monolithic integrated circuit chip with a possible exception of diode 28 so that the substrates of all the transistors therein could be electrically connected together. This is true whether the circuit of FIG. 2 is implemented by n-channel IGFET's rather than the p-channel IGFET's shown in the circuit of FIG. 2 which is entirely feasible. Certain electrical isolation arrangements need to be made for whatever device serves as diode 28, which may also be an IGFET. Note that there may be extensive circuitry present in switch control circuitry 36, as well as other kinds of circuits all present in a same monolithic integrated circuit chip all of which may be supplied electrical energy taken from capacitor 27.

The embodiments of the invention in which an exclusive property or right is claimed are defined as follows:

1. An electronic switching circuit for controlling transfer of electrical power from an alternating polarity electrical power supply means to a load means, said switching circuit comprising:

a first transfer control field-effect device provided in and on a first substrate, said first transfer control field-effect device comprising:

a first transfer control field-effect device channel region located at least in part in a first selected region of said first substrate;

first transfer control field-effect device first and second terminating regions, separated by said first transfer control field-effect device channel region into which and out of which primary currents through said first field-effect device can, at least in part, pass upon electrical energization of said first transfer control field-effect device first and second terminating regions, said first field-effect device first terminating region being electrically connected to a first terminal means adapted for electrical connection to a first circuit portion arrangement which includes both said alternating polarity electrical power supply means and said load means, said first field-effect device second terminating region being electrically connected to a second terminal means adapted for electrical connection to said first circuit portion arrangement; and a first transfer control field-effect device gate region capable of affecting, upon electrical energization thereof, any current flow occurring through said first transfer control field-effect device channel region as a result of electrical energization of said first transfer control field-effect device first and second terminating regions; and a first parasitic bypass means having first and second terminating regions and having a control region therein by which said first parasitic bypass means is capable of being directed to effectively provide a conductive path of a selected conductivity between said first parasitic bypass means first and second terminating regions, said first parasitic bypass means first terminating region being electrically connected to one of said first transfer control field-effect device first and second terminating regions, said first parasitic bypass means second terminating region being electrically connected to said first substrate, and said first parasitic bypass means control region being electrically connected to said first transfer control field-effect device gate region, whereby a path of relatively high conductivity is established between said first parasitic bypass means first and second terminating regions if said first transfer control field-effect device is directed to permit a substantial current flow through said first transfer control field-effect device channel region between said first transfer control field-effect device first and second terminating regions.

2. The apparatus of claim 1 wherein said first transfer control field-effect device gate region and said first parasitic bypass means control region are directly electrically connected to one another.

3. The apparatus of claim 1 wherein said circuit further comprises:

said first transfer control field-effect device being effectively a field-effect transistor with said first transfer control field-effect device first and second terminating regions being source and drain regions therein; and said first parasitic bypass means being a field-effect transistor with said first parasitic bypass means first and second terminating regions being source and drain regions therein separated by channel region located, at least in part, in a first selected region of a second substrate, and with said first parasitic bypass means control region being a gate region, where said first and second substrates are in common.

4. The apparatus of claim 1 wherein said circuit further comprises:

a second parasitic bypass means having first and second terminating regions between which said second parasitic bypass means is capable of effectively providing a conductive path, said second parasitic bypass means first terminating region being electrically connected to one of said first transfer control field-effect device first and second terminating regions, and said second parasitic bypass means second terminating region being electrically connected to said first substrate; and a third parasitic bypass means having first and second terminating regions between which said third parasitic bypass means is capable of effectively providing a conductive path, said third parasitic bypass means first terminating region being electrically connected to that one of said first transfer control field-effect device first and second terminating regions opposite that to which said second parasitic bypass means is connected, as aforesaid, and said third parasitic bypass means second terminating region being electrically connected to said first substrate, whereby shunting can be provided between said first substrate and said first transfer control field-effect device first and second terminating regions.

5. The apparatus of claim 1 wherein there is provided a second parasitic bypass means having first and second terminating regions between which said second parasitic bypass means is capable of effectively providing a conductive path, said second parasitic bypass means first terminating region being electrically connected to any one of said first substrate and said first transfer control field-effect device first and second terminating regions, and said parasitic bypass means second terminating region being electrically connected to said first transfer control field-effect device gate region.

6. The apparatus of claim 1 wherein there is provided first and second signal controlled directing means, each of said first and second signal controlled directing means having first and second terminating regions therein and each having a control region therein by which each of said first and second directing means is capable of being directed to effectively provide a conductive path of a selected conductivity between its first and second terminating regions, said first signal controlled directing means second terminating region being electrically connected (i) to said second signal controlled directing means first terminating region, and (ii) to said first transfer control field-effect device gate region.

7. The apparatus of claim 1 wherein said circuit further comprises:

an energy storage means having first and second polarity regions between which said energy storage means is capable of providing electrical energy storage, said energy storage means first polarity region being electrically connected to said first substrate;

a first unidirectional current conducting means having therein first and second terminating regions between which an asymmetrical current conducting capability is exhibited, said first unidirectional current conducting means first terminating region being electrically connected to said energy storage means second polarity region, said first unidirectional current conducting means second terminating region being electrically connected to a third terminal means adapted for electrical connection to both said alternating polarity electrical power supply means and said load means; and a control switch means capable, upon activation, of electrically connecting said first transfer control field-effect device gate region to a selected one of (i) said first substrate, and (ii) said first unidirectional current conducting means first terminating region, whereby electrical power can be selectively transferred from said alternating polarity electrical power supply means to said load means in correspondence with said selection of electrical connection for said first transfer control field-effect device gate region.

8. The apparatus of claim 3 wherein said first transfer control field-effect device gate region and said first parasitic bypass means control region are directly electrically connected to one another.

9. The apparatus of claim 4 wherein there is provided a fourth parasitic bypass means having first and second terminating regions between which said fourth parasitic bypass means is capable of effectively providing a conductive path, said fourth parasitic bypass means first terminating region being electrically connected to any one of said first substrate and said first transfer control field-effect device first and second terminating regions, and said fourth parasitic bypass means second terminating region being electrically connected to said first transfer control field-effect device gate region.

10. The apparatus of claim 4 wherein said circuit further comprises:

said first transfer control field-effect device being effectively a field-effect transistor with said first transfer control field-effect device first and second terminating regions being source and drain regions therein;

said first parasitic bypass means being a field-effect transistor with said parasitic bypass means first and second terminating regions being source and drain regions therein separated by a channel region located, at least in part, in a first selected region of a second substrate;

said second parasitic bypass means being a field-effect transistor with said second parasitic bypass means first and second terminating regions being source and drain regions therein separated by a channel region located, at least in part, in a first selected region of a third substrate, and with said second parasitic bypass means control region being a gate region which is electrically connected to said third parasitic bypass means first terminating region; and said third parasitic bypass means being a field-effect transistor with said third parasitic bypass means first and second terminating regions being source and drain regions therein separated by a channel region located, at least in part, in a first selected region of a fourth substrate, and with said third parasitic bypass means control region being a gate region which is electrically connected to said second parasitic bypass means first terminating region.

11. The apparatus of claim 6 wherein said circuit further comprises:

said first transfer control field-effect device being effectively a field-effect transistor with said first transfer control field-effect device first and second terminating regions being source and drain regions therein;

said first parasitic bypass means being a field-effect transistor with said first parasitic bypass means first and second terminating regions being source and drain regions therein separated by a channel region located, at least in part, in a first selected region of a second substrate;

said first signal controlled directing means being a field-effect transistor with said first signal controlled directing means first and second terminating regions being source and drain regions therein separated by a channel region located, at least in part, in a first selected region of a third substrate, and with said first signal controlled directing means control region being a gate region; and said second signal controlled directing means being a field-effect transistor with said second signal controlled directing means first and second terminating regions being source and drain regions therein separated by a channel region located, at least in part, in a first selected region of a fourth substrate, and with said second signal controlled directing means control region being a gate region.

12. The apparatus of claim 7 wherein said switch control means comprises first and second signal controlled field-effect transistors, each of said first and second signal controlled field-effect transistors having first and second terminating regions separated by channel regions and each having a gate region, said first signal controlled field-effect transistor second terminating region being electrically connected to both said second signal controlled field-effect transistor first terminating region and to said first transfer control field-effect device gate region, said first signal controlled field-effect transistor first terminating region being electrically connected to said first substrate and said second signal controlled field-effect transistor second terminating region being electrically connected to said first unidirectional current means first terminating region.

13. The apparatus of claim 7 wherein said circuit further comprises:
a second parasitic bypass means having first and second terminating regions between which said second parasitic bypass means is capable of effectively providing a conductive path, said second parasitic bypass means first terminating region being electrically connected to one of said first transfer control field-effect device first and second terminating regions, and said second parasitic bypass means second terminating region being electrically connected to said first substrate; and
a third parasitic bypass means having first and second terminating regions between which said third parasitic bypass means is capable of effectively providing a conductive path, said third parasitic bypass means first terminating region being electrically connected to that one of said first transfer control field-effect device first and second terminating regions opposite that to which said second parasitic bypass means is connected, as aforesaid, and said third parasitic bypass means second terminating region being electrically connected to said first substrate, whereby shunting can be provided between said first substrate and said first transfer control field-effect device first and second terminating regions.

14. The apparatus of claim 10 wherein said circuit further comprises:
said first transfer control field-effect device being effectively an enhancement mode, insulated-gate, field-effect transistor (IGFET) with said first transfer control field-effect device gate region being separated from said first selected region of said first substrate by an insulating layer;
said first parasitic bypass means being an enhancement mode, insulated-gate, field-effect transistor (IGFET) with said first parasitic bypass means gate region being separated from said first selected region of said second substrate by an insulating layer;
said second parasitic bypass means being an enhancement mode, insulated-gate, field-effect transistor (IGFET) with said second parasitic bypass means gate region being separated from said first selected region of said third substrate by an insulating layer; and
said third parasitic bypass means being an enhancement mode, insulated-gate, field-effect transistor (IGFET) with said third parasitic bypass means gate region being separated from said first selected region of said fourth substrate by an insulating layer, where said first, second, third, and fourth substances are in common.

15. The apparatus of claim 12 wherein said circuit further comprises:
a second parasitic bypass means having first and second terminating regions between which said second parasitic bypass means is capable of effectively providing a conductive path, said second parasitic bypass means first terminating region being electrically connected to one of said first transfer control field-effect device first and second terminating regions, and said second parasitic bypass means second terminating region being electrically connected to said first substrate; and
a third parasitic bypass means having first and second terminating regions between which said third parasitic bypass means is capable of effectively providing a conductive path, said third parasitic bypass means first terminating region being electrically connected to that one of said first transfer control field-effect device first and second terminating regions opposite that to which said second parasitic bypass means is connected, as aforesaid, and said third parasitic bypass means second terminating region being electrically connected to said first substrate, whereby shunting can be provided between said first substrate and said first transfer control field-effect device first and second terminating regions.

16. The apparatus of claim 15 wherein said first transfer control field-effect device gate region and said first parasitic bypass means control region are directly electrically connected to one another.

17. The apparatus of claim 15 wherein said circuit further comprises:
said first transfer control field-effect device being effectively a field-effect transistor with said first transfer control field-effect device first and second terminating regions being source and drain regions therein;
said first parasitic bypass means being a field-effect transistor with said parasitic bypass means first and second terminating regions being source and drain regions therein separated by a channel region located, at least in part, in a first selected region of a second substrate;
said second parasitic bypass means being a field-effect transistor with said second parasitic bypass means first and second terminating regions being source and drain regions therein separated by a channel region located, at least in part, in a first selected region of a third substrate, and with said third parasitic bypass means control region being a gate region which is electrically connected to said third parasitic bypass means first terminating region; and
said third parasitic bypass means being a field-effect transistor with said third parasitic bypass means first and second terminating regions being source and drain regions therein separated by a channel region located, at least in part, in a first selected region of a fourth substrate, and with said fourth parasitic bypass means control region being a gate region which is electrically connected to said second parasitic bypass means first terminating region.

18. The apparatus of claim 17 wherein said circuit further comprises:
said first transfer control field-effect device being effectively an enhancement mode, insulated-gate, field-effect transistor (IGFET) with said first transfer control field-effect device gate region being separated from said first selected region of said first substrate by an insulating layer;
said first parasitic bypass means being an enhancement mode, insulated-gate, field-effect transistor (IGFET) with said first parasitic bypass means gate region being separated from said first selected region of said second substrate by an insulating layer;
said second parasitic bypass means being an enhancement mode, insulated-gate, field-effect transistor (IGFET) with said second parasitic bypass means gate region being separated from said first selected region of said third substrate by an insulating layer; and said third parasitic bypass means being an enhancement mode, insulated-gate, field-effect transistor (IGFET) with said third parasitic bypass means gate region being separated from said first selected region of said fourth substrate by an insulating layer, where said first, second, third, and fourth substrates are in common.

* * * * *